US007007220B2

(12) United States Patent
Zhang et al.

(10) Patent No.: US 7,007,220 B2
(45) Date of Patent: Feb. 28, 2006

(54) ERROR CORRECTION CODING ACROSS MULTIPLE CHANNELS IN CONTENT DISTRIBUTION SYSTEMS

(75) Inventors: Wei-Min Zhang, San Jose, CA (US); Timothy A. Misko, Cupertino, CA (US)

(73) Assignee: Broadlogic Network Technologies, Inc., San Jose, CA (US)

( * ) Notice: Subject to any disclaimer, the term of this patent is extended or adjusted under 35 U.S.C. 154(b) by 407 days.

(21) Appl. No.: 10/087,202

(22) Filed: Mar. 1, 2002

(65) Prior Publication Data

US 2003/0167432 A1 Sep. 4, 2003

(51) Int. Cl.
H03M 13/00 (2006.01)

(52) U.S. Cl. ...................... 714/752; 714/712
(58) Field of Classification Search ................ 714/747, 714/804, 746, 752, 758, 712, 751; 375/265, 375/224; 370/529, 241; 329/325; 725/108
See application file for complete search history.

(56) References Cited

U.S. PATENT DOCUMENTS 4,201,976 A * 5/1980 Patel ........................... 714/804
4,980,897 A * 12/1990 Decker et al. ............... 375/265
5,455,536 A * 10/1995 Kono et al. .................. 329/325
5,949,796 A * 9/1999 Kumar ........................ 370/529
2001/0037485 A1 * 11/2001 Zhang ......................... 714/790
2002/0059633 A1 * 5/2002 Harkness et al. ............ 725/108

OTHER PUBLICATIONS

Donahoo et al., Multiple-channel multicast scheduling for scalable bulk-data transport, INFOCOM'99, Mar. 1999, vol. 2, pp. 847-855.*

* cited by examiner

*Primary Examiner*—Albert Decady
*Assistant Examiner*—Dipakkumar Gandhi
(74) *Attorney, Agent, or Firm*—Townsend and Townsend and Crew LLP (57) ABSTRACT

Error correction coding across multiple channels is provided in multi-channel transmission systems. Specifically, redundancy is provided by selecting a portion of original data from each of a plurality of original channels, performing at least one encoding operation using the portions of original data to produce at least one portion of redundancy data, including the portion of redundancy data in at least one redundancy channel, and transmitting the redundancy channel along with the original channels. Error correction is achieved by receiving at least one redundancy channel and a plurality of original channels, selecting a portion of redundancy data from the redundancy channel, selecting a portion of original data from each of the original channels, and performing at least one decoding operation using the portion of redundancy data and the portions of original data to correct at least one error in the portions of original data.

34 Claims, 6 Drawing Sheets

ERROR CORRECTION CODING ACROSS MULTIPLE CHANNELS IN CONTENT DISTRIBUTION SYSTEMS

BACKGROUND OF THE INVENTION

The present invention relates generally to error correction coding, and more particularly to a method and circuitry for error correction coding across multiple channels.

Traditional digital cable, satellite, and terrestrial distribution systems provide content streams (e.g., audio, video, data) over a large number of RF channels. Each RF channel may contain multiple content streams with each content stream typically delivered through a single RF channel. In conventional content distribution systems, each RF channel requires its own analog tuner. At the customer premises end, an end user selects a content stream via a remote control or other device. To select a particular content stream, an analog tuner is set to output only the RF channel containing the content stream of interest. A channel demodulator demodulates digital content from the tuner, and the content stream is then sent to an end user unit, which may a television, VCR, or computer.

Figure 1:
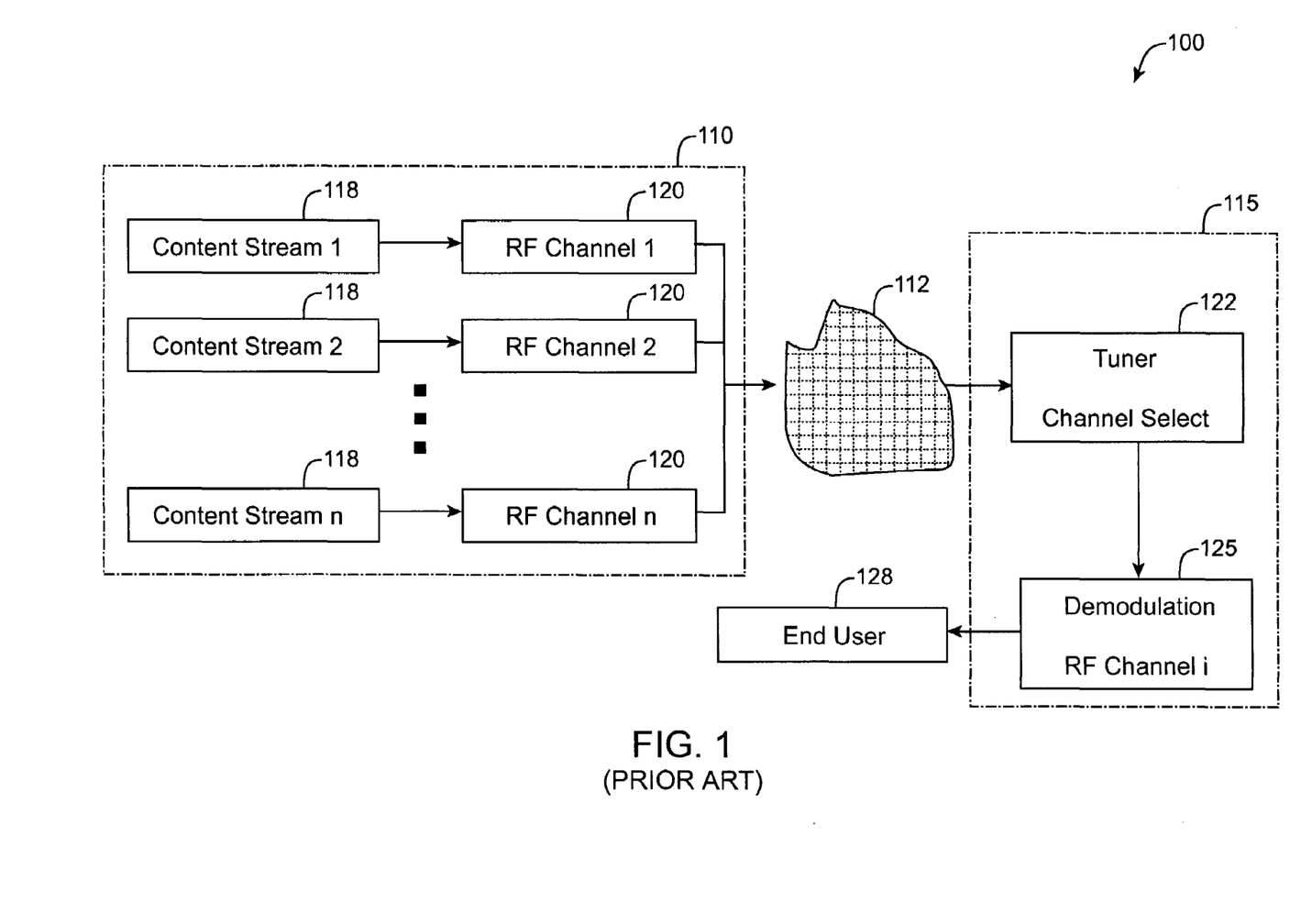
FIG. 1 is a block diagram of a traditional content distribution system.

FIG. 1 is a block diagram of a traditional content distribution system 100. The content distribution system 100 includes a content head end (CHE) 110 from which transmission originates, a medium 112 though which the transmission is sent, and customer premises equipment (CPE) 115 where the transmission is received. In a broadcast situation, more than one CPE 115 would be receiving the transmission. The CHE 110 includes n content stream blocks 118 which provide n streams of content to n corresponding RF channel blocks 120. The RF channel blocks 120 perform transmit functions such as modulation and produce n RF channels. The n RF channels form a multi-channel RF signal that is transferred through the medium 112.

Although the content distribution system 100 can include more than one CPE block 115, one CPE block 115 is expanded to show its major subsystems. The CPE 115 includes a tuner block 122 which receives one of the particular RF channels by selecting the RF channel and tuning to the RF frequency associated with that RF channel. The tuner block 122 provides the selected channel to a demodulation block 125 that demodulates the selected channel. The demodulation block 125 provides a demodulated channel signal to the end user 128 associated with the CPE 115.

A significant problem that plagues traditional content distribution systems is frequency-related interference. A myriad of possible sources may produce frequency-related interference, which can disrupt or completely preclude reception of particular RF channel(s). These sources can be internal to the system used to receive the desired signals. For example, these can be signal spectrum spurs generated by hardware within the system. These sources can also be external to the system and can thus change with the user's physical environment. Given the wide variety of possible sources of frequency-related interference in any real world environment, it may be extremely difficult to predict which RF channel will be disrupted and at what time the disruption will occur.

However, traditional content distribution systems, such as system 100, employ conventional in-channel error correction coding techniques to combat interference associated with transmission through the medium 112. Such techniques carry out error encoding and decoding for each channel independently of other channels. In the traditional content distribution system 100, in-channel encoding is performed in the RF channel blocks 120, and in-channel decoding is performed in the demodulation block 125. Accordingly, encoding performed in one RF channel block 120 is not correlated to encoding performed in another RF channel block 120. Similarly, decoding performed in the demodulation block 125 when a particular RF channel is selected does not correlate with decoding performed when another RF channel is selected.

Conventional in-channel error correction coding methods are only capable of correcting errors up to a certain level of signal degradation of the RF channel being received. If the conditions are so adverse that the RF channel is degraded beyond that level, the error correction method simply cannot recover the desired signal. This situation is played out when frequency-related interference precludes reception of a particular RF channel in a traditional content distribution system. All of the power of the interfering source is concentrated in one or more narrow bands of frequency. When a user decides to "tune in" to a particular RF channel that is sufficiently close to such a narrow frequency band of the interference, the concentrated power of the interfering source significantly impacts reception of the desired RF channel. The RF channel can easily be degraded beyond the correction ability of any reasonably designed in-channel error correction method implemented for the particular RF channel. Thus, the RF channel can be completely "knocked out."

To compound the problem, any practical solution to frequency-related interference must address the difficult issue of backward compatibility with existing equipment. Many homes and businesses have already installed expensive equipment designed for traditional content distribution systems based on individual RF channels. Any new system that requires replacement or retooling of the immense quantity of such existing equipment currently in service is likely to waste resources and faces tremendous difficulty in being introduced into the market. Thus, the problem of frequency-related interference requires a solution that retains compatibility with equipment already in place based on the traditional structure of individual RF channels.

BRIEF SUMMARY OF THE INVENTION

Error correction coding across multiple channels is provided in multi-channel transmission systems. Specifically, redundancy is provided by selecting a portion of original data from each of a plurality of original channels, performing at least one encoding operation using the portions of original data to produce at least one portion of redundancy data, including the portion of redundancy data in at least one redundancy channel, and transmitting the redundancy channel along with the original channels. Error correction is achieved by receiving at least one redundancy channel and a plurality of original channels, selecting a portion of redundancy data from the redundancy channel, selecting a portion of original data from each of the original channels, and performing at least one decoding operation using the portion of redundancy data and the portions of original data to correct at least one error in the portions of original data.

The encoding and decoding operations can correspond to a parity bit calculation, a block code such as a Reed-Solomon code, or others. In one embodiment, each portion of original data consists of a bit. In another embodiment, each portion of original data consists of a non-binary symbol.

In yet another embodiment, an adaptively controlled level of redundancy is used, the level of redundancy being adaptively controlled according to at least one measure of error-proneness associated with the original channels.

The invention will be better understood by reference to the following description in connection with the accompanying drawings.

DETAILED DESCRIPTION OF THE INVENTION

Overview

Figure 2:
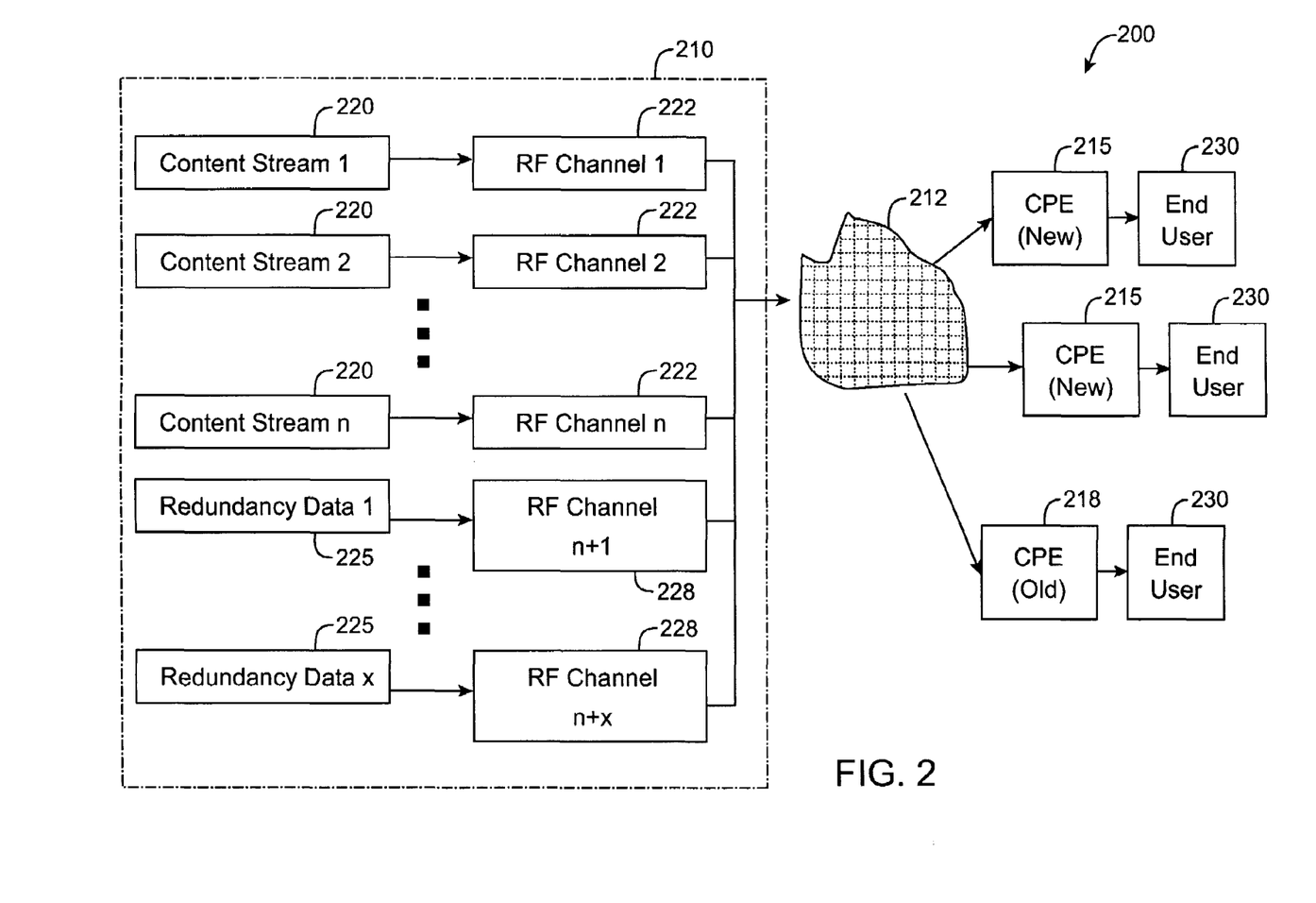
FIG. 2 is a block diagram of a content distribution system, with emphasis on details of a content head end in accordance with one embodiment of the present invention.

FIG. 2 is a block diagram of a content distribution system 200, with emphasis on details of a content head end (CHE) 210 in accordance with one embodiment of the present invention. Like the traditional content distribution system 100, the content distribution system 200 is capable of supporting n RF channels of transmission and includes CHE 210 from which transmission originates, a medium 212 though which the transmission is sent, and customer premises equipment (CPE) 215 and 218 where the transmission is received and provided to end users 230. However, unlike the traditional content distribution system 100, the content distribution system 200 supports x additional RF channel(s) which contain redundancy data produced by error correction coding performed across the original n channels. Each of the numbers n and x is a positive integer that can range from one to an arbitrary value, depending on implementation. CPE 215 is able to use the redundancy data in the x additional RF channel(s) to perform cross-channel error correction.

For clarity of illustration, each content stream described herein corresponds to an RF channel. However, the present invention is not limited to systems where a one-to-one correspondence exists between the content streams and the RF channels. The present invention is also applicable in situations where one RF channel carries one or more content stream, as well as in situations where multiple RF channels in combination can carry a single content stream. Content streams contain information that can be accessed or used by the end user(s).

Content Head End

The CHE 210 includes n content stream blocks 220 which provide the original n streams of content to n corresponding RF channel blocks 222. In addition, the CHE 210 includes x redundancy data blocks 225, each providing redundancy data to a corresponding RF channel block 228. The redundancy data is generated by cross-channel error correction encoding, which is discussed in more detail below. Like the RF channel blocks 222, the RF channel blocks 228 performs transmit functions such as modulation.

In addition to modulation, the RF channel blocks 222 and the RF channel blocks 228 may perform encoding functions associated with conventional in-channel error correction coding. As does the traditional content distribution system 100, the content distribution system 200 likely employs some form of in-channel error correction coding. As discussed above, in-channel error correction coding involves encoding and decoding for each channel that is performed independently of other channels. Here, in-channel encoding is performed in the RF channel blocks 222. Accordingly, encoding performed in one RF channel block 222 or 228 is not correlated to encoding performed in another RF channel block 222 or 228.

The output of the RF channel blocks 222 are the RF channels 1 through n, which carry content. The output of the RF channel blocks 228 are the RF channels n+1 through n+x, which carry data for error correction across the original channels 1 through n. The RF channels 1 through n and the RF channels n+1 through n+x occupy different RF frequencies and are transferred through the medium 212.

By simply adding the RF channels n+1 through n+x to carry cross-channel error correction data and leaving unchanged the structure of the original channels 1 through n, backward compatibility with existing equipment designed for traditional content distribution systems is achieved. The CHE 210 can broadcast signals that can be received by both new and old equipment, such as new CPE 215 and old CPE 218, providing content to different end users 230. To illustrate this, the figure shows multiple CPE blocks, some being old CPE 215, and some being new CPE 218. The end users are designated 230. New receive equipment, such as CPE 215, capable of processing cross-channel error correction, can receive the RF channels 1 through n as well as the RF channels n+1 through n+x transmitted by the cable head end 210. The new receive equipment would be able to take advantage of the benefits of cross-channel error correction supported by the RF channels n+1 through n+x. Old receive equipment, such as CPE 218, need not be replaced and can continue to receive the RF channels 1 through n transmitted by the cable head end 210.

In other words, users who do not want or need the new feature of cross-channel error correction do not have to modify their existing equipment to continue to receive signals from the CHE 210. Since the new RF channels n+1 through n+x are separate channels, such existing equipment can simply ignore the new RF channels n+1 through n+x. Thus, the CHE 210 can provide cross-channel error correction as a new feature without the need to replace all existing receive equipment that is already in service.

Cross-Channel Error Correction Encoding

Figure 3:
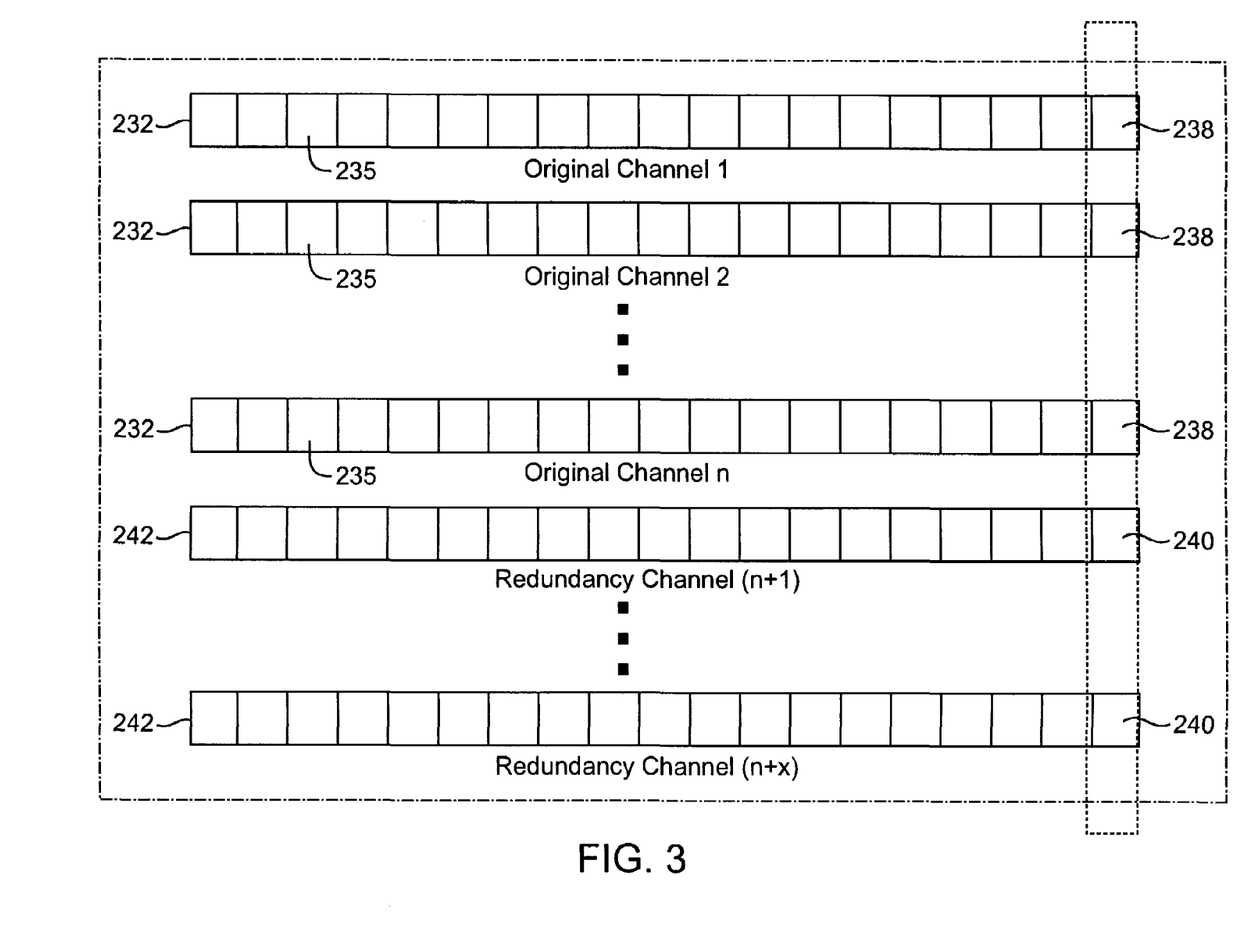
FIG. 3 illustrates cross-channel error correction encoding in accordance with one embodiment of the present invention.

FIG. 3 illustrates cross-channel error correction encoding in accordance with one embodiment of the present invention. This encoding process generates the redundancy data provided by the redundancy data blocks 225. Each of the n original streams of content provided by the n content stream blocks 220 is represented as a data sequence 232. Each data sequence 232 is made up of individual symbols 235. Each symbol 235 can be a bit, which represents a binary alphabet, but the symbol 235 need not be limited to the binary alphabet. It can also be selected from an alphabet having more than two members. For example, the symbol 235 can correspond to a byte of information, in which case the symbol 235 is selected from an alphabet having $2^8$, or 256, members. Furthermore, even if each sequence 232 is physically embodied as a collection of bits, the symbol 235 can still be represented as being selected from an alphabet having more than two members. For example, the sequence 232 may be physically stored in memory (not shown) as bits of information. However, for purposes of generating error correction data, every 8 bits of information may be translated into a byte-size symbol.

The data sequences 232, each corresponding to one of the original content streams 1 through n, are aligned. One symbol 238 is sampled from each data sequence 232 according to the alignment. That is, each symbol 238 is sampled at the same position, as defined by the alignment, from one of the data sequences 232. Since each symbol 238 is sampled from a different one of n data sequence 232, such sampling will produce n sampled symbols 238.

Cross-channel error correction encoding is performed on the n sampled symbols 238 to produce one or more error correction symbols 240. This encoding can be the encoding technique associated with any one of a wide range of different error correction coding methods, such as a simple parity bit calculation, a block code such as Reed-Solomon coding, or others. For purposes of illustration, a simple parity bit calculation for encoding is described below. In this example, each symbol is selected from a binary alphabet. That is, each symbol is a bit having a value of either "1" or "0." The n sampled symbols 238 from the original data streams 1 through n are represented as $B_1, B_2, \ldots, B_n$. The error correction symbol 240 is represented as $B_r$ and is generated according to the equation:

$$B_r = B_1 \oplus B_2 \oplus \ldots \oplus B_n$$

where the operator $\oplus$ represents the "XOR" operation. In this manner, the n sampled symbols 238 from the n channels are used to generate the error correction symbol 240.

The process of sampling n symbols 238 from each of the original content streams and performing error correction encoding on the n symbols 238 according the above equation to generate one error correction symbol 240 is repeated. The newly generated error correction symbols 240 are concatenated to form a redundancy data sequence 242, which corresponds to redundancy data provided by one of the redundancy data blocks 225 to an associated RF channel block 228. The output of the RF channel block 228 is transmitted as an additional RF channel, along with RF channels 1 through n, through the medium 112.

Note that cross-channel error correction encoding can be performed as the symbols of the n original channels are made available. Alternatively, error correction encoding can be performed all at once, if all of the symbols of an entire portion of transmission of the n original channels are available at one time. Depending on the implementation, different techniques can be used for carrying out cross-channel error correction encoding.

Cross-channel error correction encoding can be performed using all of the channels in a particular system or only a portion of such channels. Thus, the n original channels shown in FIG. 3 may represent the complete set of channels in a system or only a subset of the channels in the system. Furthermore, the present invention needs not be limited to broadcast system. Cross-channel error correction in accordance with the present invention may be realized in any system using multiple channels for data transmission.

The number of redundancy symbols produced for a given number of original channel symbols can vary depending on the error correction coding method used and the level of redundancy desired. Generally speaking, a greater the level of redundancy corresponds to more error correction capability and more redundancy symbols produced for a given number of original channel symbols. In the example of the parity bit calculation encoding described above, one error correction (redundancy) symbol 240 is produced for every n symbols 238 sampled from the original channels, generating one redundancy data sequence 242 and one corresponding redundancy channel, channel n+1. Here, the number x has a value of 1. Other encoding techniques may produce x error correction symbol 240 from the n sampled symbols 238, where x is a number greater than one. This generates x redundancy data sequences 242 and corresponding redundancy channels n+1 through n+x, as shown in FIG. 3.

The level of redundancy and the choice of error correction coding method used need not be fixed and in fact can be made to be adaptive to changing conditions. In such an adaptive system, the error-proneness of the various RF channels may be observed and used as input to adjust the type of error detection correction method and the level of redundancy used in cross-channel error correction encoding. Such error-proneness can be measured using various indicators, such as signal-to-noise ratio (SNR), signal-to-interference ratio (SIR), bit error rate (BER), and the like.

Customer Premises Equipment (CPE)

Figure 4:
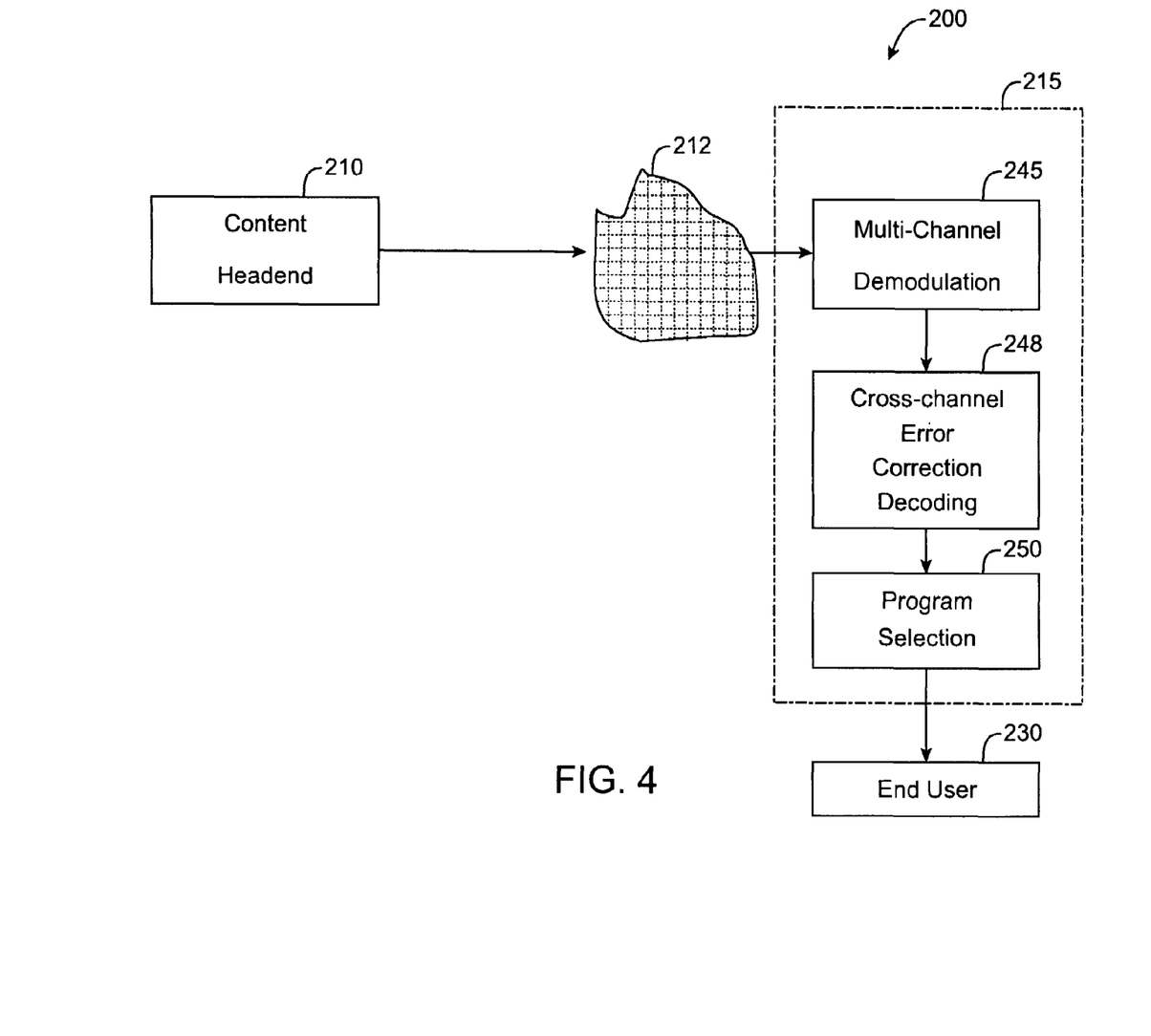
FIG. 4 is a block diagram of a content distribution system, with emphasis on details of a new customer premises equipment (CPE) in accordance with one embodiment of the present invention.

FIG. 4 is a block diagram of the content distribution system 200, with emphasis on details of a new customer premises equipment (CPE) 215 in accordance with one embodiment of the present invention. The CPE 215 receives the RF channels 1 through n and the RF redundancy channels n+1 through n+x originating from the CHE 210 and transmitted through the medium 212. The CPE 215 includes a multi-channel demodulation block 245, which performs demodulation of each of the RF channels, including the RF channels 1 through n and the RF redundancy channels n+1 through n+x. The multi-channel demodulation block 245 also carries out any in-channel error correction decoding that may need to be performed on each of the original channels 1 through n and the redundancy channels n+1 through n+x. The output of the multi-channel demodulation block 245 is in the form of processed data that has components corresponding to every channel, including the original channels 1 through n and the redundancy channels n+1 through n+x. The processed data is provided to a cross-channel error correction decoding block 248. As indicated above, the processed data is in demodulated form and may have also been decoded according to any applicable in-channel error correction scheme.

In addition to the processed data, the multi-channel demodulation block 245 may also provide other information to the cross-channel error correction decoding block 248. One important category of such information is error detection data. Generally, error detection refers to the detection of whether error(s) have occurred and/or the location of such error(s) within a portion of received data. In performing receive functions such as carrier signal reception, demodulation, and in-channel error correction decoding, the multi-channel demodulation block 245 may collect such information and provide it to the cross-channel error correction decoding block 248.

For example, if the multi-channel demodulation block 245 encounters an error-indicating condition in the demodulation of one of the RF channels 1 through n, the condition can be reported to the cross-channel error correction decoding block 248. Such a condition may include the loss of lock of frequency, phase, or timing corresponding to a particular RF channel. Such a condition may also include the loss of lock in the in-channel error correction decoding process for a particular channel. Depending on the implementation of the multi-channel demodulation block 245, different error-indicating conditions may be available. Identification of these error-indicating conditions can provide a wide range of error detection data, such as (1) occurrence of errors on a particular RF channel at particular moments in time, (2) the location of errors within a particular RF channel, (3) the loss of an entire RF channel such that all of the data in the RF channel is erroneous, and (4) others. Such information can be extremely useful to the functions of the cross-channel error correction decoding block 248.

Although FIG. 4 shows only one path connecting the multi-channel demodulation block 245 and the cross-channel error correction decoding block 248, it should be understood that the transfer of data from block 245 to block 248 needs not be restricted to a single physical path. For example, the processed data corresponding to the original channels 1 through n and the redundancy channel x may be transferred using a number of parallel paths. Alternatively, the processed data can be transferred serially along a single path. Also, data other than the processed data, such as error detection data, may be transferred using separate paths. Error detection data may alternatively be interleaved into the processed data and transferred together with the processed data. Error detection data may even be represented as a special operation performed on the processed data. An example of such a special operation is the conversion of all bits to "0" for processed data corresponding to a particular RF channel when the entire RF channel is determined to be lost and all data for the RF channel is known to be erroneous. As can be seen, the particular technique used for transferring data from block 245 to block 248 can be varied, depending on implementation. Similarly, transfer of data between other blocks can be performed in various ways and is not limited by the representation of a single path between blocks shown in the figures.

The cross-channel error correction decoding block 248 receives the processed data and available information relevant to error detection data from the multi-channel demodulation block 245. Using these inputs, the decoding block 248 performs cross-channel error correction decoding, which is described in more detail below, and outputs the resulting corrected data to a program selection block 250. The program selection block 250 is controlled to select one or more of the multiple data streams present in the corrected data. The selected data stream(s) are then provided to the end user 230.

Figure 5:
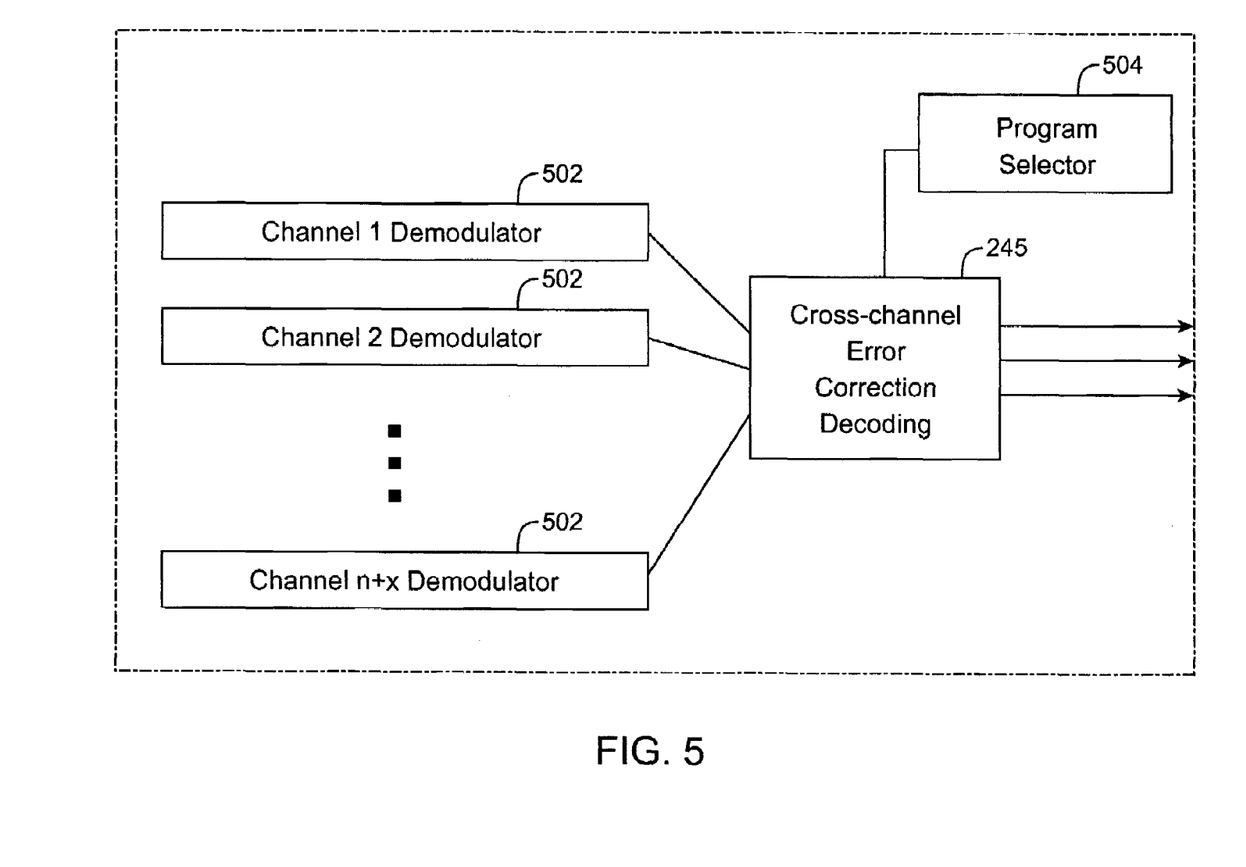
FIG. 5 is a block diagram of a particular implementation of the multi-channel demodulation block, cross-channel error correction decoding block, and program selection block.

FIG. 5 is a block diagram of a particular implementation of the multi-channel demodulation block 245, cross-channel error correction decoding block 248, and the program selection block 250. Here, the multi-channel demodulation block 245 is configured as a set of separate demodulators 502, for channels 1 through n+x. Each demodulator 502 provides a processed signal to the cross-channel error correction decoding block 248, which produces the resulting corrected data containing multiple data streams. A program selector 504 provides a selection signal to the cross-channel error correction decoding block 248. The selection signal indicates which one or more of the data streams are selected to be output. The cross-channel error correction decoding block 248 outputs the selected data streams, according to the selection signal.

Cross-Channel Error Correction Decoding

The cross-channel error correction decoding block 248 performs the functions of error detection, error correction, or both error detection and error correction. As mentioned above, error detection generally refers to the detection of whether error(s) have occurred and/or the location of such error(s) within a portion of received data. Error correction generally refers to the removal or error(s) or the reconstruction of received data such that it becomes closer to its original state before error(s) occurred. The combination of error detection and/or error correction performed by the cross-channel error correction decoding block 248 can vary according to implementation.

A wide range of different error correction coding methods can be used in cross-channel error correction, as already discussed. These include a simple parity bit calculation, a block code such as Reed-Solomon coding, or others. Depending on the particular coding method used, the cross-channel error correction decoding block 248 may perform its functions in different ways. In some coding methods, error detection and error correction are performed in a single step. In other coding methods, error detection and error correction are performed in separate steps. Also, in many coding methods, the performance of error detection and/or error correction can be improved if some error detection data is already known. For example, error detection data provided by the multi-channel demodulation block 245 can improve the performance of the cross-channel error correction decoding block 248 as it carries out error detection, error correction, or both error detection and error correction.

Figure 6:
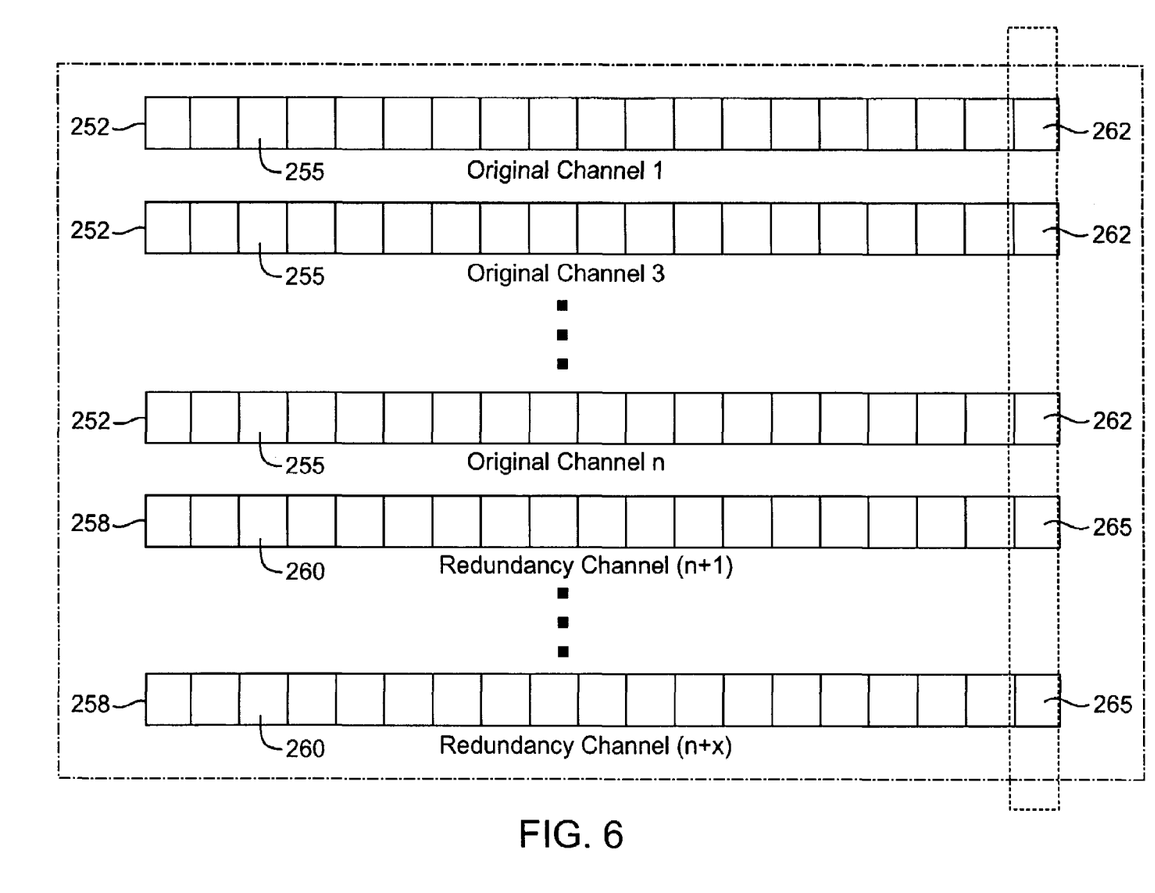
FIG. 6 illustrates cross-channel error correction decoding in accordance with one embodiment of the present invention.

FIG. 6 illustrates cross-channel error correction decoding in accordance with one embodiment of the present invention. This decoding process uses redundancy data provided by the redundancy channels n+1 through n+x to perform error detection, error correction, or both error detection and error correction to recover data in the original channels 1 through n. As discussed previously, the number x is a positive integer that can range from one to an arbitrary value, depending on implementation. The processed data provided by the multi-channel demodulation block 245 contains data corresponding to each of the original channels 1 through n as well as the redundancy channels n+1 through n+x. Data corresponding to each of the original channels 1 through n is represented as a data sequence 252. Each data sequence 252 is made up of individual symbols 255. Data corresponding to the redundancy channels n+1 through n+x is represented as data sequences 258. Each data sequence 258 is made up of individual symbols 260. As in the encoding process, the symbols 255 and 260 can be selected from a binary alphabet or a non-binary alphabet.

The data sequences 252 and the data sequences 258 are aligned. One symbol 262 is sampled from each of the data sequences 252 according to this alignment. One symbol 265 is sampled from each of the data sequences 258, also according to this alignment. Thus, each symbol 262 represents a symbol sampled from a different original channel, and each symbol 265 represents a symbol sampled from a different redundancy channel. Note that in FIG. 6, the data sequence corresponding to the original channel 2 is missing. This can illustrate that the processed data corresponding to the original channel 2 is either unavailable or otherwise impaired. For instance, it may already be known that the original channel 2 is corrupted with errors, given information provided by the multi-channel demodulation block 245 regarding the detection of error-indicating conditions on channel 2. Alternatively, the absence of the original channel 2 in FIG. 6 can indicate a systematic process by which some or all of the channels are individually restored. In such a scenario, FIG. 6 merely indicates that channel 2 happens to be the channel being restored at a particular point in such a systematic process.

In any case, FIG. 6 shows that cross-channel error correction decoding is used to reconstruct data in the original channel 2. The n−1 symbols 262 from the available original channels (channels 1 through n, less channel 2) and the symbols 265 from the redundancy channels n+1 through n+x are used in the decoding process to produce a reconstructed symbol for the original channel 2. As discussed above, this decoding can be the decoding technique associated with any one of a wide range of different error correction coding methods. For the purpose of illustration, only a simple parity bit calculation for decoding is discussed below, corresponding to the parity bit calculation for encoding already described. Consistent with that encoding technique, symbols are selected from a binary alphabet. That is, each symbol is a bit having a value of either "1" or "0." The n−1 sampled symbols 262 from the different n−1 available channels are represented as $B_1, B_3, B_4, \ldots, B_n$. In this example, there is only one redundancy channel, channel n+1. The one sampled symbol 265 from the redundancy channel n+1 is represented as Br. The reconstructed symbol for the missing original channel 2 is represented as $B_2$ and is generated according to the equation:

$$B_2 = B_1 \oplus B_3 \oplus B_4 \oplus \ldots \oplus B_n \oplus B_r$$

where the operator $\oplus$ represents the "XOR" operation. Thus, the n−1 sampled symbols 262 from the n−1 available original channels and the sampled symbol 265 from the redundancy channel n+1 are used to reconstruct the a corresponding symbol for the missing original channel 2.

The process of sampling from each of the n−1 available channels and the redundancy channel n+1 and performing error correction decoding to generate a reconstructed symbol for channel 2 is repeated. Each tire the process is repeated, a new set of n−1 symbols 262 and a new symbol 265 is sampled, and a symbol for channel 2 is reconstructed. The reconstructed symbols are concatenated to form an new data sequence that represents the reconstructed channel 2. In this manner, error correction is performed such that channel 2 can be completely reconstructed from original channels 1, 3, 4, . . . , n and the redundancy channel n+1.

Cross-channel error correction may correct a wide variety of different types of error. Although FIG. 6 illustrates the continuous reconstruction of an entire channel, cross-channel error correction is not limited to this type of error correction. For example, error correction can be successively performed for different channels. That is, one error correction step may reconstruct a symbol for channel 2, and the next error correction step may reconstruct a symbol for channel 7. Thus, the present invent may be used to correct errors caused by frequency-related interference appearing at different frequencies at different times. Cross-channel error correction performed on different channels is well suited to unpredictable and sporadic interference common in real world environments.

The capabilities of cross-channel error correction depends on the type of error correction coding method used. The bit parity calculation shown above as an illustrative example can reconstruct a single channel. Other error correction coding methods are capable of handling error on more than one channel. If such other methods are used, more than one missing channel can be reconstructed. Accordingly, it should be clear that FIG. 6, which only shows one channel to be missing, is merely an illustrative example and is not intended to limit the scope of the present invention.

The bit parity calculation shown above as an illustrative example also does not detect the existence or location of error(s). The technique is only capable of reconstructing a channel if it is know which channel needs to be reconstructed. Thus, the technique relies on information, such as the error-indicating conditions described previously, for identification of the channel on which error(s) exist.

Other error correction coding methods are capable of detecting the existence and/or location of errors. Using such other methods, the existence and/or location of errors can first be detected, then the errors can be corrected. Nevertheless, such other error correction coding methods may still take advantage of the error-indicating conditions described previously. For example, a specific Reed-Solomon code may be able to detect the location of one error and also correct the error. Alternatively, the same Reed-Solomon code may be able to correct two errors, if the location of the errors are known. Thus, if an error-indicating condition (e.g. a loss of lock of frequency, phase, or timing associated with two RF channels) indicates the location of the errors (e.g. the two symbols corresponding to the two RF channels experiencing loss of lock), the Reed-Solomon code would be able to correct both errors because it the location of each of the two errors is known. Without utilizing the error-indicating condition, the same Reed Solomon code would only be able to locate one error and correct that error.

As is the case in cross-channel error correction encoding, cross-channel error correction decoding can be performed as the symbols of the original channels are made available. Alternatively, such decoding can be performed all at once, if all of the symbols of an entire portion of transmission of the received original channels used in decoding are available at one time. Depending on the implementation, different techniques can be used for carrying out cross-channel error correction decoding.

Although the present invention has been described in terms of specific embodiments, it should be apparent to those skilled in the art that the scope of the present invention is not limited to the described specific embodiments.

The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A method for providing redundancy to multi-channel data transmission comprising:
    selecting a portion of original data from each of a plurality of original channels adapted to transmission through a communication medium;
    performing at least one encoding operation using said portions of original data from the plurality of original channels to produce at least one portion of redundancy data;
    including said portion of redundancy data in at least one redundancy channel; and
    transmitting said redundancy channel along with said original channels through said communication medium.

2. The method of claim 1 wherein said selecting, performing, and including steps are repeated before said transmitting step.

3. The method of claim 1 further comprising the step of:
while performing said transmitting step, repeating said selecting, performing, and including steps.

4. The method of claim 1 wherein said encoding operation corresponds to a parity bit calculation.

5. The method of claim 1 wherein said encoding operation corresponds to a block code.

6. The method of claim 5 wherein said block code is a Reed-Solomon code.

7. The method of claim 1 wherein an adaptively controlled level of redundancy is used to perform said encoding operation, said level of redundancy being adaptively controlled according to at least one measure of error-proneness associated with said original channels.

8. The method of claim 7 wherein said measure of error-proneness is a signal-to-noise ratio (SNR), signal-to-interference ratio (SIR), or bit error rate (BER).

9. A method for correcting error in multi-channel data transmission having redundancy, the method comprising:
receiving at least one redundancy channel and a number of original channels belonging to a plurality of original channels, said at least one redundancy channel and said plurality of original channels being transmitted over a communication medium;
selecting a portion of redundancy data from said redundancy channel wherein said redundancy data is generated from original data from the plurality of original channels;
selecting a portion of original data from each of said number of original channels; and
performing at least one decoding operation using said portion of redundancy data and said portions of original data to correct at least one error in said plurality of original channels.

10. The method of claim 9 wherein said step for performing at least one decoding operation comprises the step of:
detecting the existence of at least one error.

11. The method of claim 10 wherein said step for detecting the existence of at least one error comprises the step of:
monitoring at least one error-indicating condition during said receiving step.

12. The method of claim 11 wherein said error-indicating condition relates to carrier signal reception.

13. The method of claim 11 wherein said error-indicating condition relates to demodulation.

14. The method of claim 11 wherein said error-indicating condition relates to in-channel error correction decoding.

15. The method of claim 9 wherein said step for performing at least one decoding operation comprises the step of:
detecting the location of at least one error.

16. The method of claim 15 wherein said step for detecting the location of at least one error comprises the step of:
monitoring at least one error-indicating condition during said receiving step.

17. The method of claim 16 wherein said error-indicating condition relates to carrier signal reception.

18. The method of claim 16 wherein said error-indicating condition relates to demodulation.

19. The method of claim 16 wherein said error-indicating condition relates to in-channel error correction decoding.

20. The method of claim 9 wherein said step for performing at least one decoding operation further comprises the step of:
correcting at least one error.

21. The method of claim 9 wherein said steps for selecting a portion of redundancy data, selecting a portion of original data, and performing at least one decoding operation are repeated after said receiving step.

22. The method of claim 9 wherein said steps for selecting a portion of redundancy data, selecting a portion of original data, and performing at least one decoding operation are repeated while performing said receiving step.

23. The method of claim 9 wherein said decoding operation corresponds to a parity bit calculation.

24. The method of claim 9 wherein said decoding operation corresponds to a block code.

25. The method of claim 24 wherein said block code is a Reed-Solomon code.

26. The method of claim 1 or 9 wherein said portions of original data are selected from a common position within their respective original channels.

27. The method of claim 1 or 9 wherein each said portion of original data consists of a bit.

28. The method of claim 1 or 9 wherein each said portion of original data consists of a non-binary symbol.

29. The method of claim 1 or 9 wherein said communication medium is cable-based.

30. The method of claim 1 or 9 wherein said communication medium is satellite-based.

31. The method of claim 1 or 9 wherein said communication medium is terrestrial.

32. The method of claim 1 or 9 wherein said original channels contain audio, video, and/or data signals.

33. A system for providing redundancy to multi-channel data transmission comprising:
means for selecting a portion of original data from each of a plurality of original channels adapted to transmission over a communication medium;
means for performing at least one encoding operation using said portions of original data from the plurality of original channels to produce at least one portion of redundancy data;
means for including said portion of redundancy data in at least one redundancy channel; and
means for transmitting said redundancy channel along with said original channels in said communication medium.

34. A system for correcting error in multi-channel data transmission having redundancy, the system comprising:
means for receiving at least one redundancy channel and a plurality of original channels transmitted over a communication medium;
means for selecting a portion of redundancy data from said redundancy channel wherein said redundancy data is generated from original data from the plurality of original channels;
means for selecting a portion of original data from each of said original channels; and
means for performing at least one decoding operation using said portion of redundancy data and said portions of original data to correct at least one error in said portions of original data.

* * * * *